United States Patent [19]

Tanaka et al.

[11] Patent Number: 5,247,189
[45] Date of Patent: Sep. 21, 1993

[54] SUPERCONDUCTING DEVICE COMPOSED OF OXIDE SUPERCONDUCTOR MATERIAL

[75] Inventors: Saburo Tanaka; Hideo Itozaki; Shuji Yazu, all of Itami, Japan

[73] Assignee: Sumitomo Electric Industries, Ltd., Osaka, Japan

[21] Appl. No.: 845,752

[22] Filed: Mar. 2, 1992

Related U.S. Application Data

[63] Continuation of Ser. No. 614,315, Nov. 15, 1990, abandoned.

[30] Foreign Application Priority Data

Nov. 15, 1989 [JP] Japan .................................. 1-296740

[51] Int. Cl.$^5$ ..................... H01L 29/00; H01L 39/12; H01B 12/00
[52] U.S. Cl. ........................................ 257/32; 257/30; 257/31; 257/33; 257/34; 257/35; 257/36; 505/1
[58] Field of Search ...................... 357/5, 83; 307/306; 257/30, 31, 32, 33, 34, 35, 36; 505/1

[56] References Cited

U.S. PATENT DOCUMENTS

| | | | |
|---|---|---|---|
| 4,660,061 | 4/1987 | Sweeny et al. ..................... | 505/874 |
| 4,837,609 | 6/1989 | Gurvitch et al. ..................... | 357/71 |
| 4,878,094 | 10/1989 | Balkanski ................................ | 357/5 |
| 4,971,948 | 11/1990 | Dam et al. .............................. | 505/1 |
| 4,980,580 | 12/1990 | Ghoshal ............................. | 307/306 |
| 4,980,754 | 12/1990 | Kotani et al. ......................... | 357/83 |

FOREIGN PATENT DOCUMENTS 60-177691 9/1985 Japan .
63-313877 12/1988 Japan .

OTHER PUBLICATIONS

Ito et al. "Highly Sensitive Photodetection using a microwave-coupled $BaPb_{0.7}Bi_{0.3}O_3$ Josephson Junction Array" Appl. Phys. Lett. vol. 43(3) Aug. 1, 1983 pp. 314–316.

Naito et al. "Electron Tunneling Studies of Thin Films of High-$T_c$ Superconducting La-Sr-Cu-O" vol. 35, No. 13 American Phys. Society Physical Review B, May 1987.

Akoh et al. "SNS Josephson Junction Consisting of YBaCuO/Au/Nb Thin Films" Jap. J. Appl. Phys. vol. 27 No. 4 Apr. 1988 pp. L519-L521.

Suzuki et al. "A Capacitively Coupled SFQ Josephson Memory Cell" IEEE Trans Electron Devices vol. 35 No. 7, Jul. 1988 pp. 1137-1143.

Cohen et al. "High Frequency flux flow in Y-Ba-Cu-O/Ag/Y-BaCu-O Thin Film Superconducting-Normal-Superconducting Junctions" American Physical Society Physical Rev. B. vol. 41 No. 16 Jun. 1, 1990 pp. 11619-11622.

Primary Examiner—Andrew J. James
Assistant Examiner—Valencia M. Martin
Attorney, Agent, or Firm—Pennie & Edmonds

[57] ABSTRACT

A tunnel junction type superconducting device includes a pair of superconductor electrodes formed of compound oxide superconductor material, and a metal layer of a high electric conductivity formed between the pair of superconductor electrodes so as to maintain the pair of superconductor electrodes separate from each other. The pair of superconductor electrodes is separated from each other by a distance within a range of 3 nm to 70 nm by action of the metal layer.

8 Claims, 3 Drawing Sheets

SUPERCONDUCTING DEVICE COMPOSED OF OXIDE SUPERCONDUCTOR MATERIAL

This is a in-part continuation of application Ser. No. 07/614,315, filed Nov. 15, 1990, now abandoned.

BACKGROUND OF THE INVENTION

1. Field of the Invention

The present invention relates to a superconducting device, and more specifically to a superconducting device composed of a normal conductor layer sandwiched between a pair of superconductor electrodes so as to separate the pair of superconductor electrodes from each other in close proximity to each other, so that superconduction current flows through the normal conductor layer.

2. Description of Related Art

One typical example of superconductor technology applied to electronic devices is a Josephson junction formed of a weak linkage between a pair of superconductor electrodes. A Josephson junction may be comprised of various type junctions, among which a junction called a "tunnel type" is said to have the most preferable characteristics. The tunnel type Josephson junction device is currently used in various superconductive elements such as high sensitive sensors, superconductive transistors, etc. The tunnel Josephson junction is basically comprised of a pair of superconductor electrodes separated by a non-superconductor layer sandwiched between the pair of superconductor electrodes so that the pair of superconductor electrodes are in close proximity to each other but not in direct contact with each other.

In superconducting devices, including the above mentioned tunnel Josephson junction, each of the superconductor electrodes can be formed of various superconductive material. Examples of superconductive material from which the superconductor electrodes can be formed are metal type superconductive materials and so-called compound oxide superconductive materials. The non-superconductor layer sandwiched between the pair of superconductor electrodes can be formed of a material selected from a group consisting of insulator materials and normal conductor materials. The selection of material from which the non-superconductor layer is formed is based on the use of the superconductive device.

Furthermore, in the superconducting devices, including the tunnel Josephson junction, the thickness of the non-superconductor layer, defined as the distance between the pair of superconductor electrodes separated by the non-superconductor layer, is very significant. Determination of the preferred value of the distance between the pair of superconductor electrodes is a function of the coherence length of superconductive electrons in the non-superconductor layer and of the coherence length of the superconductor electrodes. If this distance is too large or to small, proper operation of the Josephson junction cannot be insured.

In general, compound oxide superconductive materials have a short coherence length. Therefore, for a superconducting device in which the superconductor electrodes are comprised of a compound oxide superconductive material it is difficult to select both a functional non-superconductive material and a functional thickness of the non-superconductor material layer.

SUMMARY OF THE INVENTION

Accordingly, it is an object of the present invention to provide a superconducting device having a tunnel Josephson junction formed by superconductor electrodes composed of a compound oxide superconductor material, which overcomes the above mentioned defects in the prior art and which can stably operate at a high temperature.

The above and other objects of the present invention are achieved by the present invention by a tunnel junction type superconducting device including a pair of superconductor electrodes formed of compound oxide superconductor material, and a normal conductor layer formed between the pair of superconductor electrodes so as to maintain the pair of superconductor electrodes separate from each other, the normal conductor layer being formed of a metal having a high electric conductivity, and the pair of superconductor electrodes being separated from each other by a distance within a range of 3 nm to 70 nm by presence of the metal normal conductor layer.

The superconducting device of the present invention is characterized in that the pair of superconductor electrodes formed of compound oxide superconductor material are separated from each other by the metal layer which is sandwiched between the pair of superconductor electrodes and which has a high electric conductivity and a thickness within a range of 3 nm to 70 nm. The metal having a high electric conductivity includes all metals which are good electric conductors. In addition, the coherence length in a normal conductor is in proportion to a square root of a mean free path of an electron and a Fermi velocity. From this view point, it can generally be said that the metal has a coherence length longer than those of a semiconductor and an insulator.

With this arrangement, the present invention has succeeded in giving an optimum structure for superconducting device having the superconductor electrodes formed of compound oxide superconductor material. The metal used for forming the normal conductor layer in the superconducting device in accordance with the present invention, is preferably selected from a metal having a high electric conductivity and a high corrosion-resistivity, for example, Au, Pt, Pd, Rh, Cu and Ag. The reason for this is that when the superconductor electrode is formed of a thin layer of compound oxide superconductor material, this layer is grown or deposited under oxidation atmosphere.

The metal thin layer, which constitutes the normal conductor layer in the superconducting device in the present invention, has a thickness within the range of 3 nm to 70 nm. If the thickness of the metal thin layer is less than 3 nm, the metal thin layer does not function as a normal conductor, and therefore, cannot exert characteristics of the Josephson junction. If the thickness of the metal thin layer is greater than 70 nm, a superconduction current cannot flow through the metal thin layer, and therefore, a function of the Josephson junction cannot be obtained. Accordingly, the thickness of the metal layer forming the normal conductor layer should be within the range of 3 nm to 70 nm.

In the superconducting device in accordance with the present invention, the superconductor electrodes can be formed of any compound oxide superconductor material without restriction. However, Y-Ba-Cu-O oxide superconductor typified by $Y_1Ba_2Cu_3O_x$ ($6 < x \leq 7$), Bi-Sr-Ca-Cu-O oxide superconductor typified by $Bi_2Sr_2Ca_2Cu_3O_y$ ($7 \leq y \leq 10$), and Tl-Ba-CA-CU-O oxide superconductor typified by $Tl_2Ba_2Ca_2Cu_3O_z$ ($7 \leq z \leq 10$) are preferred, since these materials have a high critical temperature which can be sufficiently refrigerated with a liquid nitrogen ($N_2$).

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Figure 1:
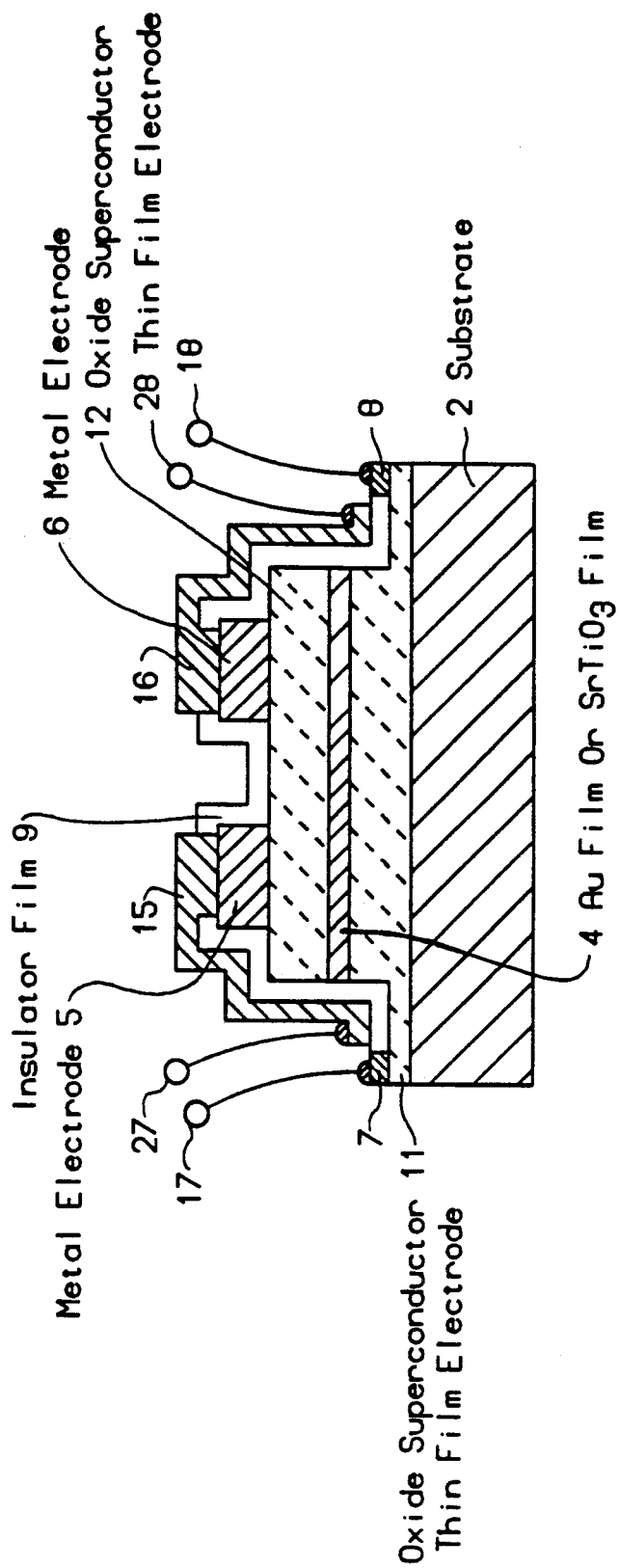
FIG. 1 is a diagrammatic section view illustrating one example of a superconducting device in accordance with the present invention.

Referring to FIG. 1, there is shown a diagrammatic section view illustrating one example of a superconducting device formed in accordance with the present invention. The superconducting device shown in FIG. 1 is a so-called Josephson junction device. The shown device includes a first superconducting electrode 11 formed of $Y_1Ba_2Cu_3O_x$ thin film formed on a MgO substrate 2, an Au (gold) thin layer 4 formed on a central portion of the first superconducting electrode 11, and a second superconducting electrode 12 formed of $Y_1Ba_2Cu_3O_x$ thin film formed on the Au thin layer 4 without directly contacting the first superconducting electrode 11. The central portion of the first superconducting electrode 11, the metal thin layer 4 and the second superconducting electrode 12 form a rectangular or trapezoidal shape. A pair of metal electrodes 5 and 6 are located on the second superconducting electrode 12. In addition, another pair of metal electrodes 7 and 8 having connecting terminals 17 and 18, respectively, are provided respectively on opposite end portions of the first superconducting electrode 11 on which the Au layer 4 is not formed. The metal electrodes 5 and 6 excluding an upper surface thereof are covered with an insulating layer 9, and metal layers 15 and 16 are formed on the insulating layer 9 so as to extend from the upper surfaces of the metal electrode 5 and 6 and to be connected to connecting terminals 27 and 28 in proximity to the metal electrodes 7 and 8, respectively.

In the above mentioned superconducting device, the maximum thickness of each of the first and second superconducting electrodes 11 and 12 is 400 nm, and the thickness of the Au layer 4 is 10 nm. In addition, the metal electrodes 5 and 6 formed on the second superconducting electrode 12 are formed in a double-layered structure having an lower layer of Ag in contact with the second superconducting electrode 12 and an upper layer of Au formed on the Ag lower layer. This double-layered metal electrode does not give an adverse influence to the compound oxide superconductor, and has an excellent adhesion or bonding property to the compound oxide superconductor.

Now, a process for forming the above mentioned superconducting device will be explained with reference to FIGS. 2A to 2G.

Figure 2A:
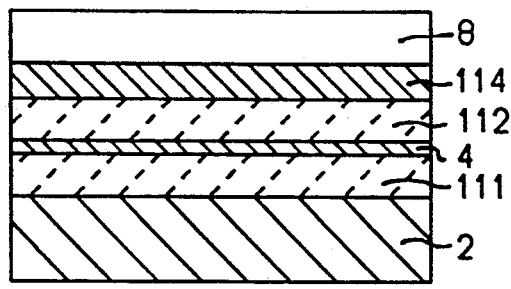
FIG. 2A to 2G are diagrammatic section views illustrating the process for manufacturing the superconducting device shown in FIG. 1.

As shown in FIG. 2A, a first $Y_1Ba_2Cu_3O_x$ superconductor thin film 111, an Au layer 4, a second $Y_1Ba_2Cu_3O_x$ superconductor thin film 112 and a metal layer 114 were formed on a (100) plane surface of the MgO substrate 2 in the named order in such a manner that each layer completely covers an upper surface of a just-lower layer. The first $Y_1Ba_2Cu_3O_x$ superconductor thin film 111 and the second $Y_1Ba_2Cu_3O_x$ superconductor thin film 112 were deposited to have a thickness of 400 nm by sputtering, respectively. The Au layer 4 was deposited to have a thickness of 10 nm by vacuum evaporation. The metal layer 114 was formed by depositing an Ag layer of 150 nm thickness by vacuum evaporation and also depositing an Au layer of 150 nm thickness on the Ag layer by vacuum evaporation. Thereafter, a photoresist layer 8 is deposited on the metal layer 114, as shown in FIG. 2A.

Figure 2B:
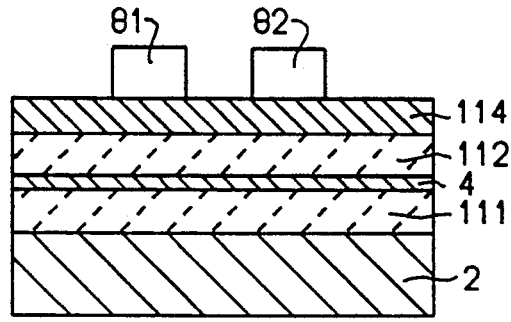
Figure 2C:
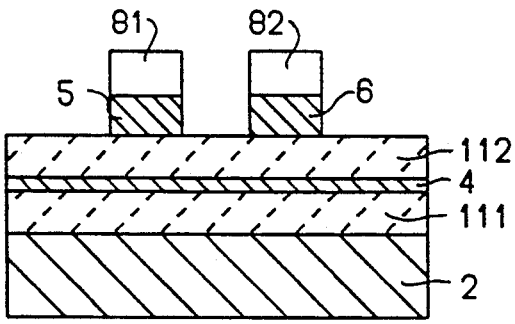

Then, as shown in FIG. 2B, the photoresist layer 114 was patterned so that resist masks 81 and 82 are left on portions of the metal layer 114 which become the metal electrodes in future. Ar-ion etching was performed by using the remaining resists 81 and 82 as a mask, so that the metal layer 114 not covered with the remaining resists 81 and 82 are completely removed. As a result, the metal electrodes 5 and 6 are formed as shown in FIG. 2C.

Figure 2D:
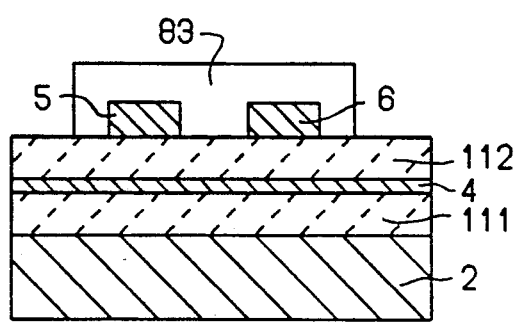
Figure 2E:
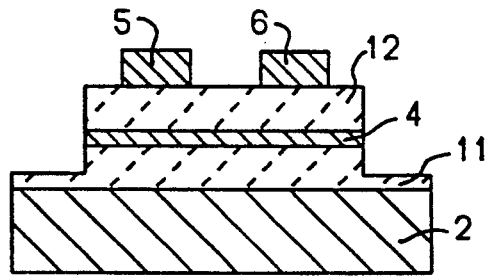

Thereafter, as shown in FIG. 2D, a photoresist layer 83 is deposited on the second $Y_1Ba_2Cu_3O_x$ superconductor thin film 112 so as to cover the metal electrodes 5 and 6. Again, Ar-ion etching was performed by using the photoresist 83 as a mask, so that the second $Y_1Ba_2Cu_3O_x$ superconductor thin film 112 and the Au layer 4 which are not covered with the photoresist 83, were completely removed, and the first $Y_1Ba_2Cu_3O_x$ superconductor thin film 111 which is not covered with the photoresist 83, was partially removed, with the result that the first superconducting electrode 11 and the second superconducting electrode 12 are formed as shown in FIG. 2E.

Figure 2F:
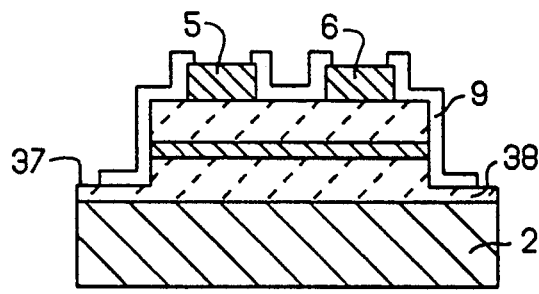

Furthermore, as shown in FIG. 2F, an insulating layer 9 is formed to cover portions excluding opposite end portions 37 and 38 of the first superconducting electrode 11 and an upper surface of each of the metal electrodes 5 and 6.

Figure 2G:
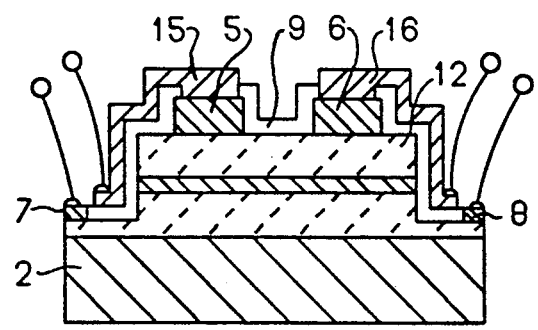

As shown in FIG. 2G, metal electrodes 7 and 8 are formed on exposed opposite end portions 37 and 38 of the first superconducting electrode 11, and metal layers 15 and 16 are formed to cover the upper surface of the metal electrodes 5 and 6 and to extend from the upper surface of the metal electrodes 5 and 6 on the surface of the insulating layer 9. Thus, the superconducting device shown in FIG. 1 is completed.

In the above mentioned process for manufacturing the superconducting device, only a portion of a relatively thick oxide superconductor thin film formed on a whole is etched so as to have a reduced thickness, in order to form an oxide superconductor thin film having different thickness portions. Accordingly, in the case of forming an oxide superconductor thin film having different thickness portions on a given surface, growth of an oxide superconductor thin film on the given surface can be performed in one step. Namely, an oxide superconductor thin film having a thickness equal to that of the thickest portion of the oxide superconductor thin film having different thickness portions is formed with the one step. Thereafter, a thin portion and/or unnecessary portion is formed or removed by electively etching the oxide superconductor thin film having the thickness equal to that of the thickest portion.

The fact that the growth of an oxide superconductor thin film on the given surface is performed in one step, means that, in the case having a structure, as in a tunnel junction structure, in which a non-superconductor is integrally sandwiched between a pair of superconductor thin films, a required number of superconductor thin films are formed in a single continuous step. In addition, in the oxide superconductor thin film of a stacked-layer structure in which a plurality of layers of oxide superconductor thin films and a non-superconductor thin film are stacked, these layers are preferably formed in a manner that the substrate is never taken out of a chamber of a film formation or deposition device until an uppermost layer is deposited, so that the oxide superconductor will never be contacted with air in the course of the oxide superconductor thin film formation process.

Since epitaxy of thin film is performed in one step, a uniform oxide superconductor thin film having a good crystalline condition can be obtained. Therefore, in case of forming a junction such as a superconducting tunnel junction between an oxide superconductor thin film and another thin film, not only a uniform oxide superconductor thin film having a good crystalline condition can be obtained, but also a good boundary can be formed at the junction portion.

The superconduction property of the oxide superconductor thin film is greatly influenced by a crystalline orientation and composition. Therefore, an oxide superconductor thin film formed by many repetitions of separate deposition cannot have a continuous crystal, and a boundary adversely occurs, with the result that a uniform superconduction property cannot be obtained. Needless to say, this oxide superconductor thin film is not suitable to form a superconducting tunnel junction. The characteristics of the superconducting tunnel junction is also greatly influenced by a condition of boundary in the junction portion. Particularly, if a surface or portion to be brought into the boundary is contacted with air in the manufacturing process and the surface condition is caused to adversely change, a desired characteristics of the superconducting tunnel junction cannot be obtained. However, if the above mentioned process is used, this problem can be overcome.

Figure 3:
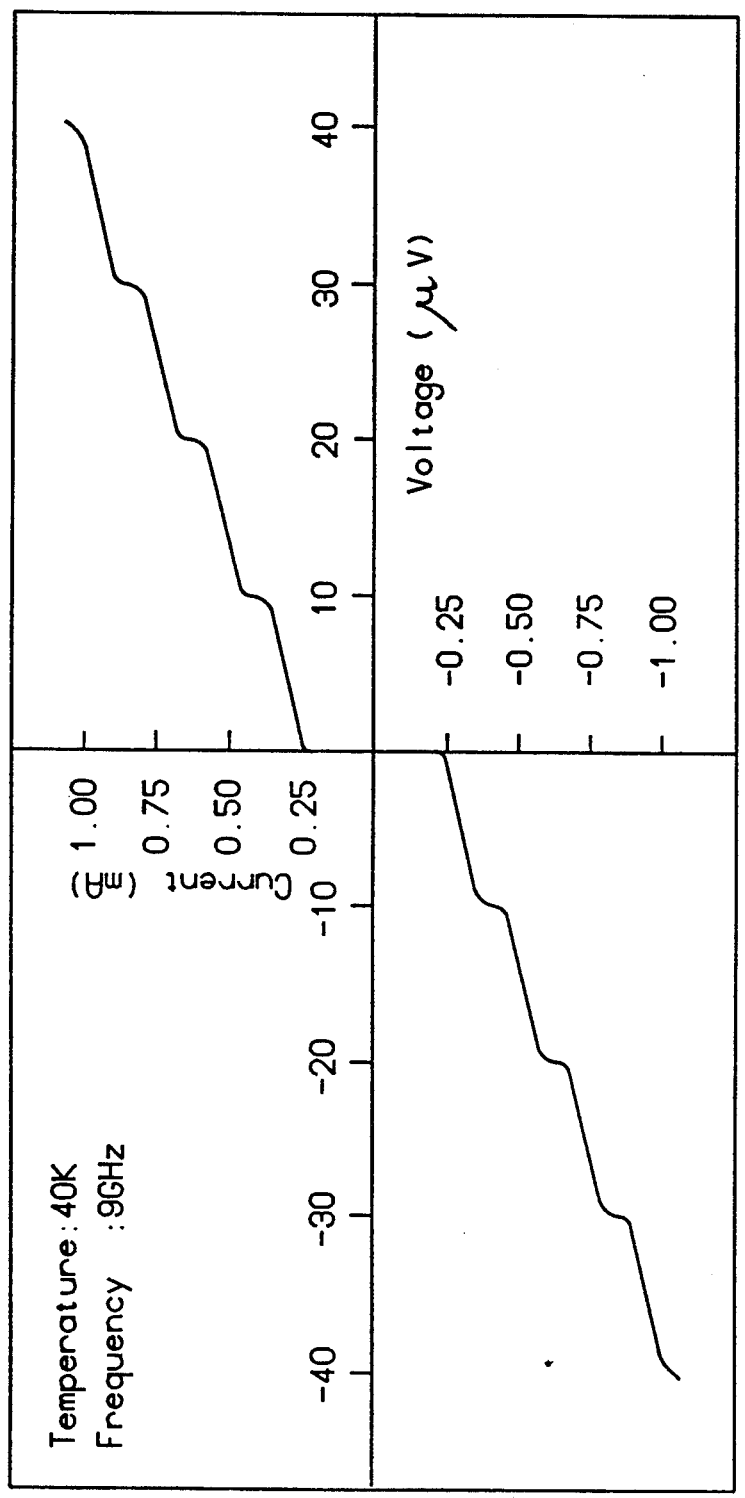
FIG. 3 is a graph illustrating a current-voltage characteristics of the superconducting device shown in FIG. 1.

A current-voltage characteristics of the above mentioned superconducting device is shown in FIG. 3. At a temperature of 40 K., the above mentioned superconducting device responded to a microwave of 9 GHz and stably operated with a clear Shapiro step.

As seen from the above description, the present invention has succeeded in forming the superconducting device having the superconductor electrodes formed of compound oxide superconductor material and including a tunnel Josephson junction. Therefore, the superconducting device in accordance with the present invention can operate at a temperature higher than that of the conventional superconducting devices. Accordingly, the present invention would further facilitate utilization of superconduction technique for superconducting devices.

The invention has thus been shown and described with reference to the specific embodiments. However, it should be noted that the present invention is in no way limited to the details of the illustrated structures but changes and modifications may be made within the scope of the appended claims.

We claim:

1. A tunnel junction type superconducting device including a pair of superconductor electrodes formed of compound oxide superconductor material wherein said superconductor electrodes are selected from the group consisting of Y-based oxidesuperconductor, Bi-based oxide superconductor and Tl-based oxide superconductor, and a normal conductor layer formed between said pair of superconductor electrodes so as to maintain said pair of superconductor electrodes separate from each other, said normal conductor layer being formed of a metal selected from a group consisting of Au, Pt, Pd, Rh, Cu and Ag, said pair of superconductor electrodes being separated from each other by a distance within a range of 3 nm to 70 nm by the presence of said normal conductor layer.

2. The superconducting device claimed in claim 1 wherein said normal conductor layer is (gold).

3. The superconducting device claimed in claim 1 wherein said pair of superconductor electrodes are separated from each other by a distance of 10 nm by the presence of said normal conductor layer.

4. The superconducting device claimed in claim 1 wherein said superconductor electrodes are selected from the group consisting of Y-Ba-Cu-O oxide superconductor, Bi-Sr-Ca-Cu-O oxide superconductor, and Tl-Ba-Ca-Cu-O oxide superconductor.

5. A Josephson device comprising a first superconductor electrode formed of oxide superconductor thin film wherein said first superconductor electrode is selected from the group consisting of Y-based oxide superconductor, Bi-based oxide superconductor, and Tl-based oxide superconductor formed on a substrate, a metal thin layer formed of a metal selected from the group consisting of Au, Pt, Pd, Rh, Cu and Ag formed on a central portion of said first superconducting electrodes and a second superconducting electrode formed of oxide superconductor thin film wherein said second superconducting electrode is selected from the group consisting of Y-based oxide superconductor, Bi-based oxide superconductor, and Tl-based oxide superconductor formed on said metal thin layer without directly contacting said first superconducting electrode, a first and second metal electrodes located on said second superconducting electrode separately from each other, third and second metal electrodes provided respectively on opposite end portions of said first superconducting electrode under which said metal thin layer is not formed, said metal thin layer having a thickness within a range of 3 nm to 70 nm.

6. The Josephson device claimed in claim 5 wherein the central portion of said first superconducting electrode, said metal thin layer formed on said central portion of said first superconducting electrode, and said superconducting electrode formed on said metal thin layer cooperate to form a projection having a trapezoidal sectional shape.

7. The superconducting device claimed in claim 1 wherein said superconductor electrodes are epitaxial copper oxide type superconductors.

8. The Josephson device claimed in claim 5 wherein said superconductor electrodes are an epitaxial copper oxide type superconductors.

* * * * *